(12) United States Patent
Suzuki et al.

(10) Patent No.: US 6,969,262 B2
(45) Date of Patent: Nov. 29, 2005

(54) IC SOCKET

(75) Inventors: Katsumi Suzuki, Tokyo (JP); Takehiro Ito, Sakata (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/233,500

(22) Filed: Sep. 4, 2002

(65) Prior Publication Data

US 2003/0045136 A1 Mar. 6, 2003

(30) Foreign Application Priority Data

Sep. 5, 2001 (JP) ........................................ 2001-268985

(51) Int. Cl.$^7$ .............................................. H01R 12/14
(52) U.S. Cl. ...................................................... 439/66
(58) Field of Search .............................. 439/66, 67, 69, 439/71, 73, 733.1; 257/693, 696

(56) References Cited

U.S. PATENT DOCUMENTS 4,548,451 A * 10/1985 Benarr et al. ................. 439/66
5,173,055 A * 12/1992 Grabbe ......................... 439/66
5,297,967 A * 3/1994 Baumberger et al. ......... 439/66
5,629,837 A * 5/1997 Barabi et al. ................ 361/767
6,474,997 B1 * 11/2002 Ochiai .......................... 439/66

FOREIGN PATENT DOCUMENTS

| JP | 06-313788 | 11/1994 |
|---|---|---|
| JP | 08-018292 | 1/1996 |
| JP | 08-068829 | 3/1996 |
| JP | 10-022024 | 1/1998 |
| JP | 11-204223 | 7/1999 |

* cited by examiner

*Primary Examiner*—Renee Luebke
(74) *Attorney, Agent, or Firm*—Finnegan, Henderson, Farabow, Garrett & Dunner, LLP

(57) ABSTRACT

An IC socket formed by attaching a socket frame to a test board via a contact sheet, wherein the contact sheet has a plurality of cantilever spring type contacts arranged on a insulation film and a spacer member, to tightly attach the socket frame to the test board via the contact sheet without any inclination.

14 Claims, 24 Drawing Sheets

IC SOCKET

This application is based on Patent Application No. 2001-268985 filed Sep. 5, 2001 in Japan, the content of which is incorporated hereinto by reference.

BACKGROUND OF THE INVENTION

1. Field of the Invention

The present invention relates to an IC socket for carrying out various tests of an IC package, in which a socket frame is attached to a test board via a contact sheet. Particularly, the present invention relates to an IC socket for mounting an IC package to a test board via a contact sheet for the purpose of carrying out the high frequency test.

2. Description of the Related Art

An IC socket has been known in the prior art, for carrying out various tests such as a high frequency test for an electronic part such as an IC package or others in which the IC package is mounted to an IC socket attached to a test board via a contact sheet and secured by a pusher such as a pressure plate.

The contact sheet in such a conventional IC socket and the steps for manufacturing the same are illustrated in FIGS. 14 to 24. First, FIG. 14 is a perspective view of the contact sheet of the prior art IC socket; FIG. 15 is a perspective view of a back surface of the contact sheet shown in FIG. 14; FIG. 16 is an enlarged sectional view of a mounting screw when the prior art IC socket is assembled; FIG. 17 is a sectional view of part of the prior art IC socket along the mounting screws when the socket frame is warped during the manufacture or the assembly thereof; FIG. 18 is a sectional view of part of the prior art IC socket along the mounting screws when the socket frame is inclined during the manufacture or assembly thereof; FIG. 19 is a perspective view illustrating the stamping of a sheet at a first step of the manufacture of the conventional IC socket; FIG. 20 is a perspective view illustrating the temporary application of adhesive at a second step subsequent to FIG. 19; FIG. 21 is a perspective view illustrating the etching of contacts at a third step subsequent to FIG. 20; FIG. 22 is a perspective view illustrating the press-bending of the contacts at a fourth step subsequent to FIG. 21; FIG. 23 is a perspective view illustrating the thermocompression bonding of the contacts and the sheet at a fifth step subsequent to FIG. 22; and FIG. 24 is a perspective view illustrating the cutting of excessive portions of the contacts at a sixth step subsequent to FIG. 23.

The prior art IC socket basically has the same structure as that of the present invention shown in FIGS. 1 and 2, wherein a contact sheet is placed on a test board, and a socket frame is mounted and fixed thereon by screws and nuts to form an integral body.

As shown in FIGS. 14 and 15, a contact sheet 103 used for the prior art IC socket has a plurality of contacts 108 of elastic metallic strips which are adhered to an insulation film 109, for example, of polyimide via a heat-compressive adhesive sheet 111. One end 108a of the respective elastic metallic strips of the contact 108 are positioned on circuits of a test board 102, and the insulation film 109 is adhered thereon so that free ends 108b of the contacts 108 are bent to have a wave shape.

For example, as shown in FIGS. 16 to 18, such a contact sheet 103 of the prior art IC socket is placed on the test board 102, and the socket frame 104 is mounted thereon, which assembly is then fastened together with screws 105 and nuts 106. Since it is adapted that the IC package (not shown) is mounted on the fastened socket frame 104 so that IC leads are disposed on the contacts 108 and pressed by a pusher (not shown), the free ends 108b of the contacts 108 are located above the circuits of the test board 102 to make the electric connection between the both.

In the prior art IC socket 100 of such a structure, when the contact sheet is mounted on the test board 102, a gap S is created between the test board 102 and the contact sheet 103 as shown in FIGS. 16 to 18. If the mounting screws 105 are threaded and fastened with nuts 106, the socket frame 104 may be warped or inclined, resulting in that a problem in that the socket frame 104 can not uniformly press the contact sheet 103.

The steps of the manufacture of the prior art contact sheet used for the IC socket described above are shown in FIGS. 19 to 24.

First, as shown in FIG. 19, at a first step of the manufacture of the contact sheet for the IC socket, an insulation film 109 such as that of polyimide is stamped to have the illustrated shape. On the respective opposite edge of the stamped insulation film 109 of the illustrated shape, the heat-compressive adhesive sheet 111 used as an adhesive is temporarily adhered at a second step as shown in FIG. 20. Simultaneously therewith, or subsequently thereto, the contacts 108 are formed by an etching from a suitable sheet metal 107 at a third step as shown in FIG. 21, whereby metallic strips as a raw material of the contacts 108 are prepared.

Then, at a fourth step as shown in FIG. 22, the contacts are bent by a press machine to form bending free ends 108b of the contacts 108. Thereafter, the insulation film 109 on which the heat-compressive adhesive sheet 111 is temporarily adhered is placed on the sheet metal 107 having free ends 108b of the contacts 108 as a fifth step shown in FIG. 23.

Excessive portions on the periphery of the sheet metal 107 of the contact sheet 103 on which the insulation film 109 is heat-compressively adhered is cut off as a sixth step, and the contact sheet 103 of a required shape is formed as shown in FIG. 24.

However, in the prior art IC socket 100 using such a contact sheet 103, when it is mounted onto the test board 102 as described above, the gap S may be created between the test board 102 and the contact sheet 103. If the mounting screws 105 are fastened under the condition, the socket frame 104 may be warped or inclined, resulting in the problem in that the socket frame 104 can not uniformly press the contact sheet 103.

Accordingly, an object of the present invention is to provide an IC socket having a spacer member in a contact sheet so that the contact sheet is in tight contact with a test board via the spacer member without any inclination when the socket frame is mounted to the test board via the contact sheet.

SUMMARY OF THE INVENTION

To achieve the above object, according to the present invention, an IC socket formed by attaching a socket frame to a test board via a contact sheet is provided, wherein the contact sheet has a plurality of cantilever spring type contacts arranged on an insulation film and a spacer member. Thereby, since the spacer member made of the same material as the contacts is disposed on the periphery of the mounting screws on the back surface of the contact sheet, it is possible to bring the test board into tight contact with the socket frame, whereby the socket frame can uniformly press to secure the contact sheet without any looseness.

According to the IC socket of the present invention, the cantilever spring type contacts are made of sheet metal into strips and opposed to each other. Thereby, it is possible to obtain an IC socket wherein the contacts are easily manufactured, which is capable of elastically supporting the IC package.

Further, according to the IC socket of the present invention, the cantilever spring type contact is fixed at one end and has a free end at the other end curved to be located above the test board at a distance therefrom. Therefore, it is possible to elastically and displacably support the IC leads of the IC package by the cantilever spring type contacts of the contact sheet to reduce the maximum stress in the contact. Also, it is possible to easily adjust the contacting force and the displacement amount as well as to facilitate the durability.

According to the IC socket of the present invention, the spacer member is made of the sheet metal of the contact simultaneously therewith. Therefore, it is possible to easily manufacture the IC socket at a low cost with the same material without incurring waste as well as increasing the manufacturing steps.

According to the IC socket of the present invention, the spacer member is adhered to the insulation film of the contact via a heat-compressive adhesive sheet, so that it is possible to form the spacer member simultaneously with the contacts in a simple manner.

According to the IC socket of the present invention, the insulation film of the contact sheet to be attached to the socket frame is made of polyimide which enables an easy manufacturing of the contact sheet at a low cost.

According to the IC socket of the present invention, a flat plate type IC package is mounted to the socket frame attached to the test board via the contact sheet. Therefore, it is possible to properly mount the IC package on the IC socket and easily adjust the contacting force and the displacement amount as well as to facilitate the durability.

According to the IC socket of the present invention, IC leads of the flat plate type IC package are brought into contact with the cantilever spring type contacts of the socket frame. Therefore, it is possible to properly and easily mount the IC package on the socket frame.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

Figure 1:
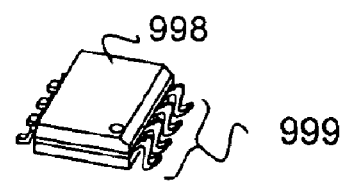
FIG. 1 is a perspective view showing an appearance of an IC socket according to one embodiment of the present invention.
Figure 1:
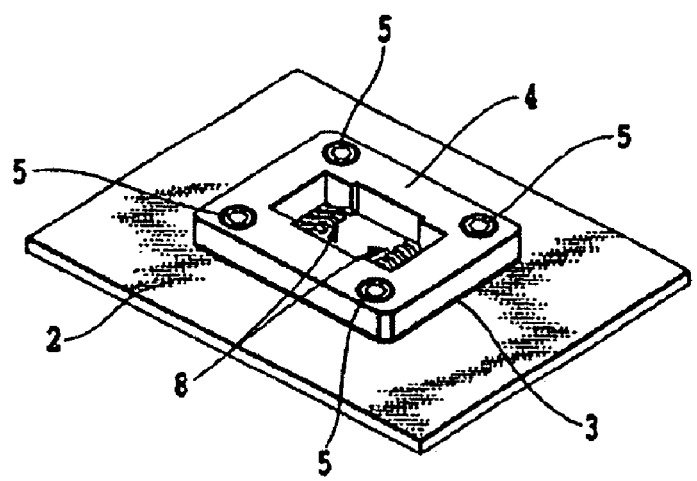
Figure 2:
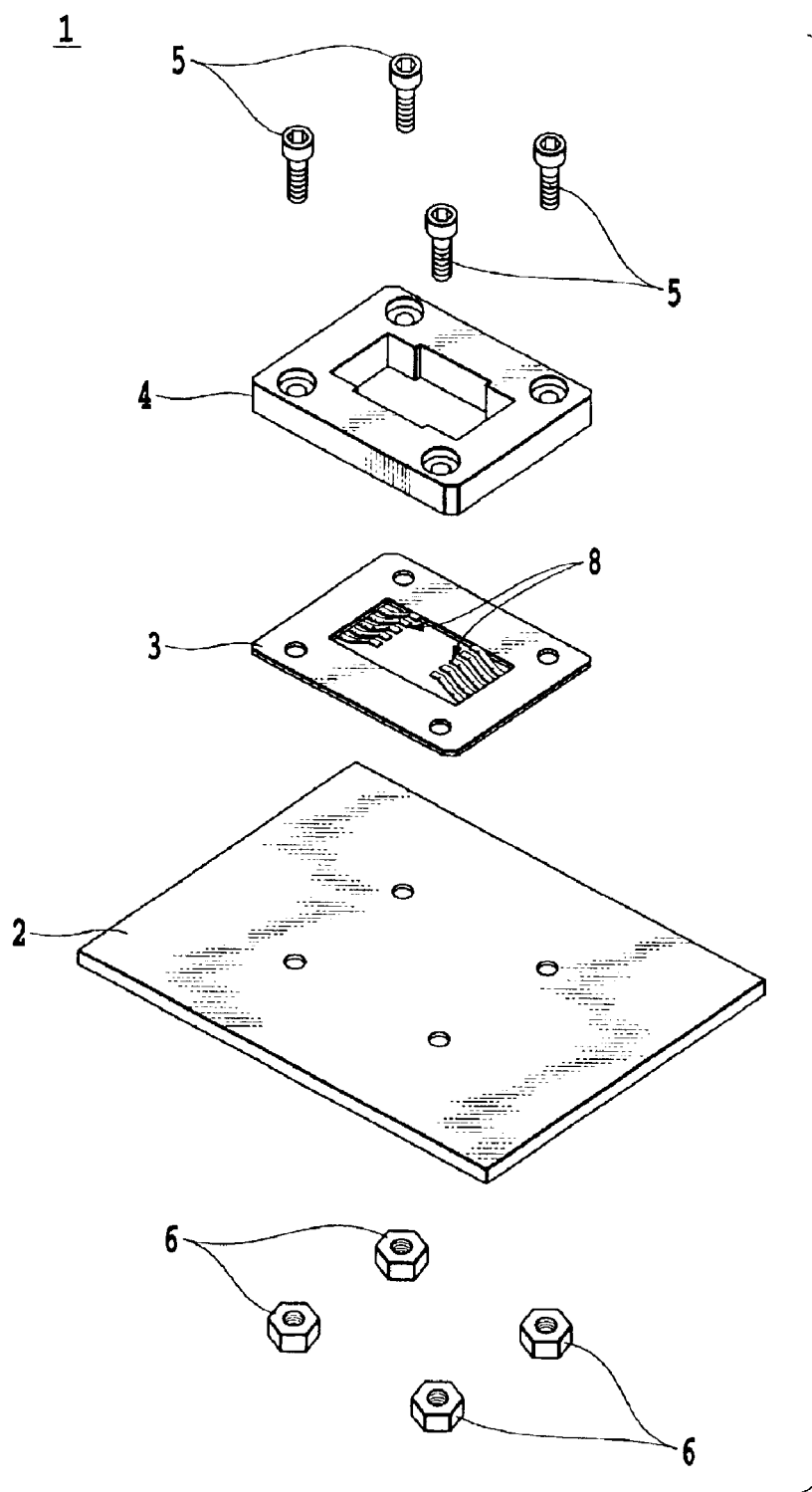
FIG. 2 is an exploded perspective view showing the IC socket according to the embodiment of the present invention shown in FIG. 1.
Figure 3:
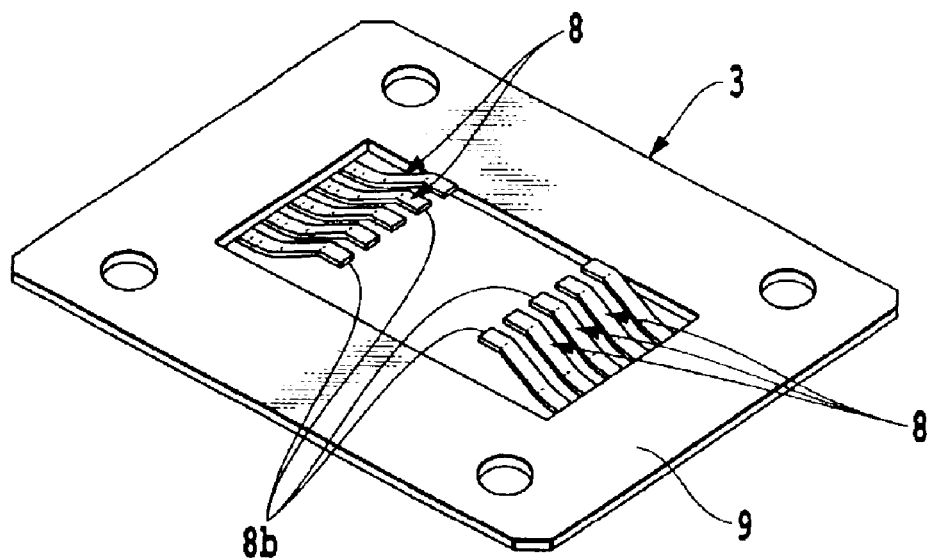
FIG. 3 is a perspective view of a contact sheet of the IC socket according to the embodiment of the present invention shown in FIG. 2.
Figure 4:
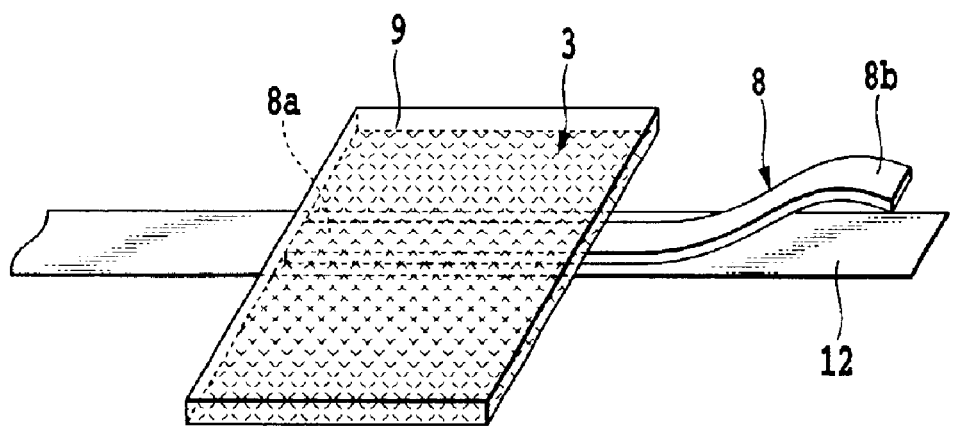
FIG. 4 is a diagrammatic perspective view of one contact of the IC socket according to the embodiment according to the present invention shown in FIG. 1.
Figure 5:
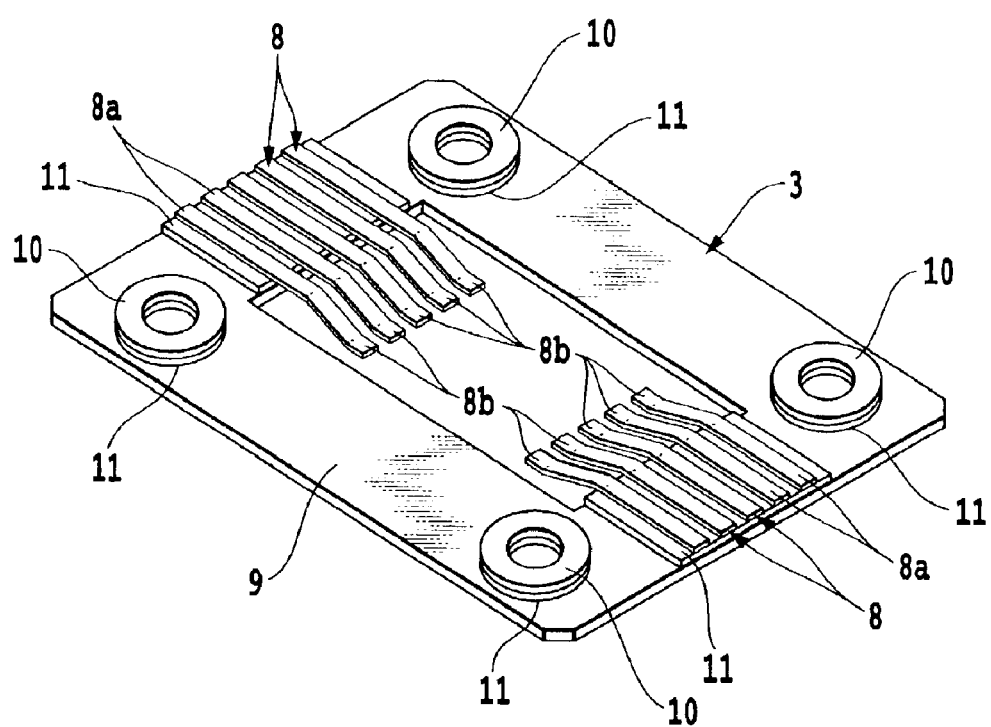
FIG. 5 is a perspective view of a back surface of the contacts of the IC socket according to the embodiment of the present invention shown in FIG. 3.
Figure 6:
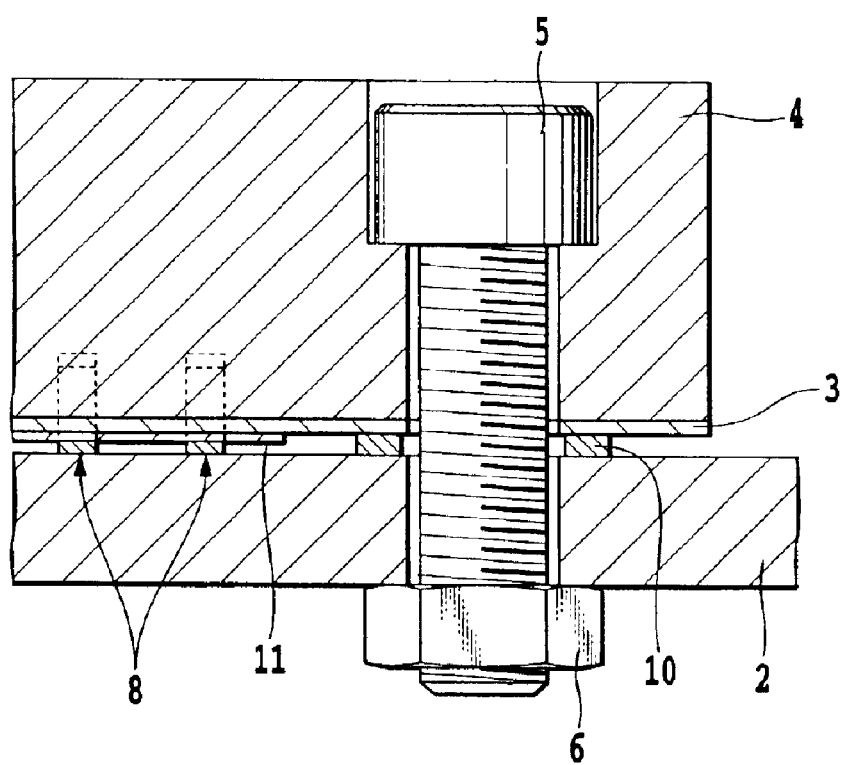
FIG. 6 is an enlarged sectional view of part of the IC socket illustrating a mounting screw when the IC socket according to the embodiment of the present invention shown in FIG. 1 is assembled.
Figure 7:
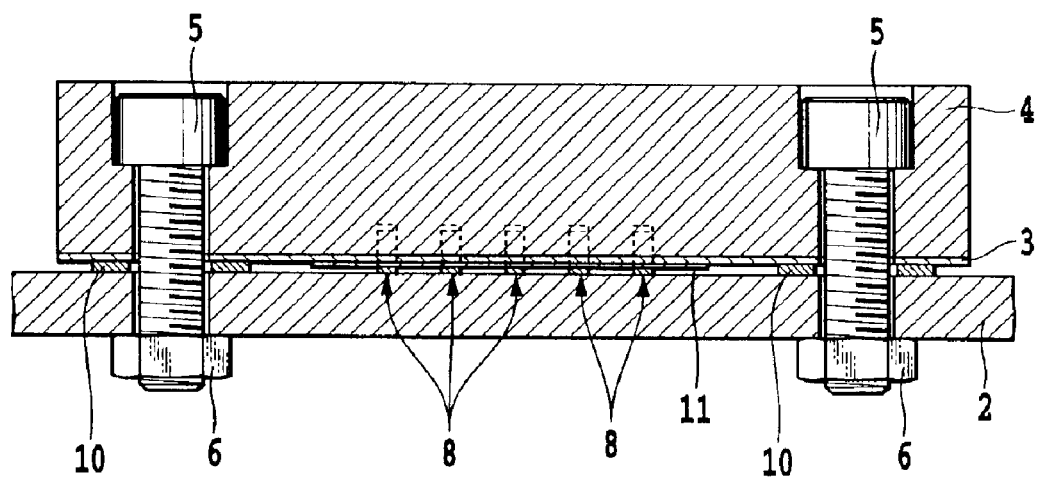
FIG. 7 is a sectional view of the IC socket according to the embodiment of the present invention shown in FIG. 6, taken along the mounting screws when the IC socket is manufactured and assembled.
Figure 8:
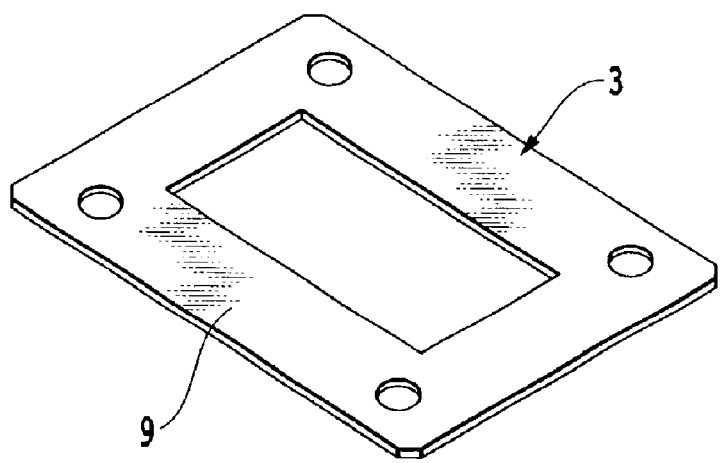
FIG. 8 is a perspective view of a stamped insulation film of the contact sheet at a first step of the manufacture of the IC socket according to the present invention.
Figure 9:
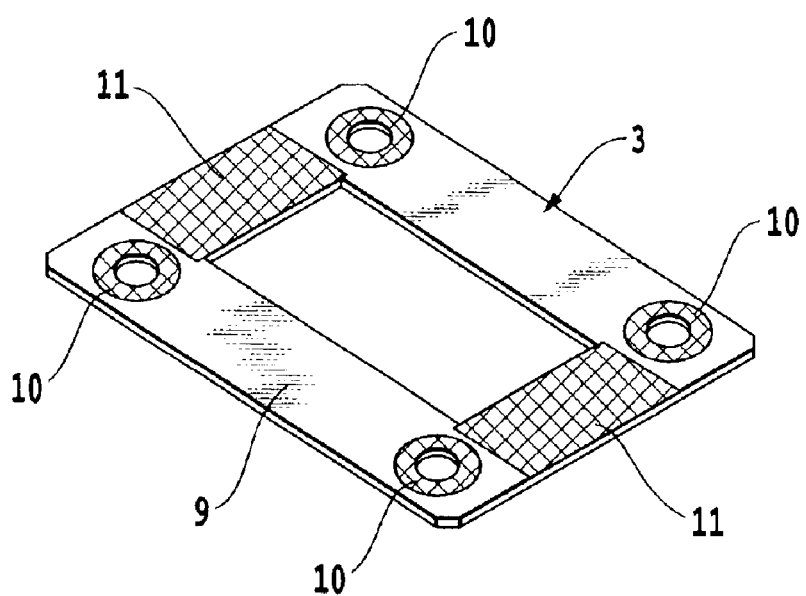
FIG. 9 is a perspective view of a second step subsequent to FIG. 8, wherein an adhesive is temporarily adhered.
Figure 10:
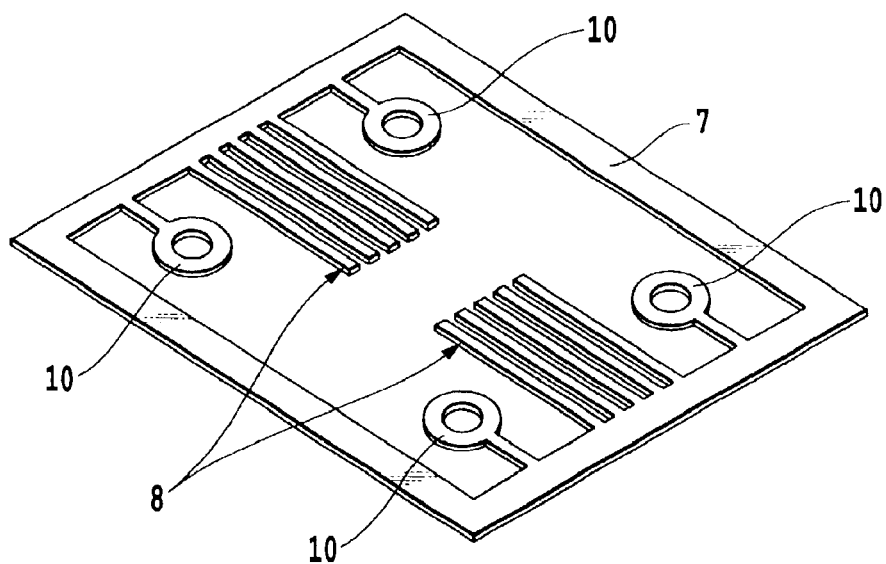
FIG. 10 is a perspective view of a third step subsequent to FIG. 9, wherein contacts are formed by the etching.
Figure 11:
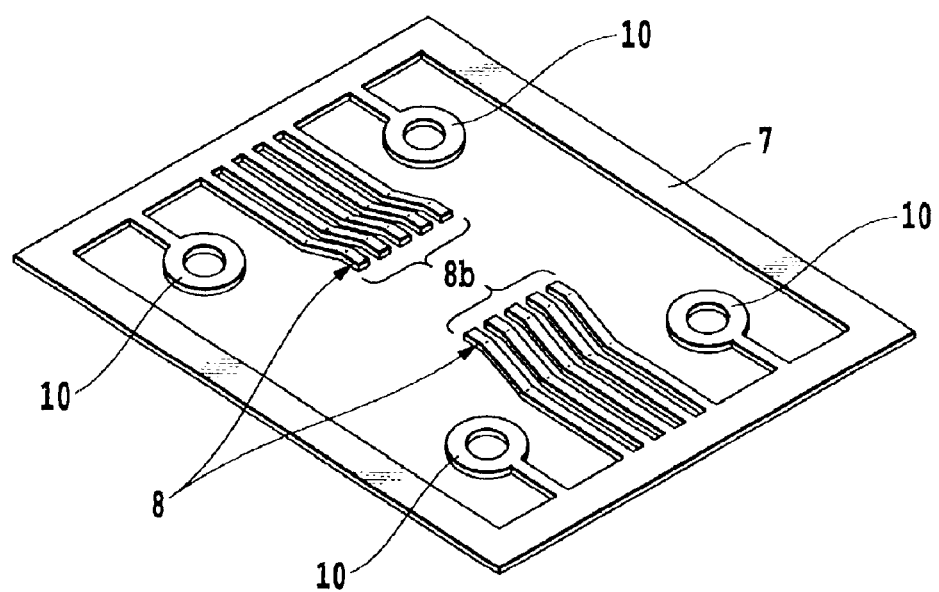
FIG. 11 is a perspective view of a fourth step subsequent to FIG. 10, wherein the contacts are bent by the press.
Figure 12:
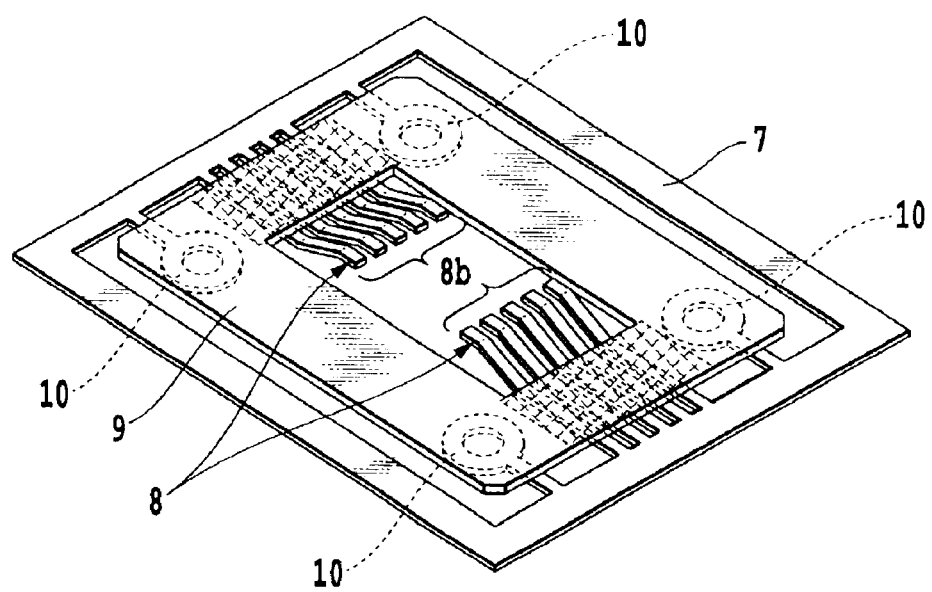
FIG. 12 is a perspective view of a fifth step subsequent to FIG. 11, wherein the contacts and the insulation film are heat-compressively adhered.
Figure 13:
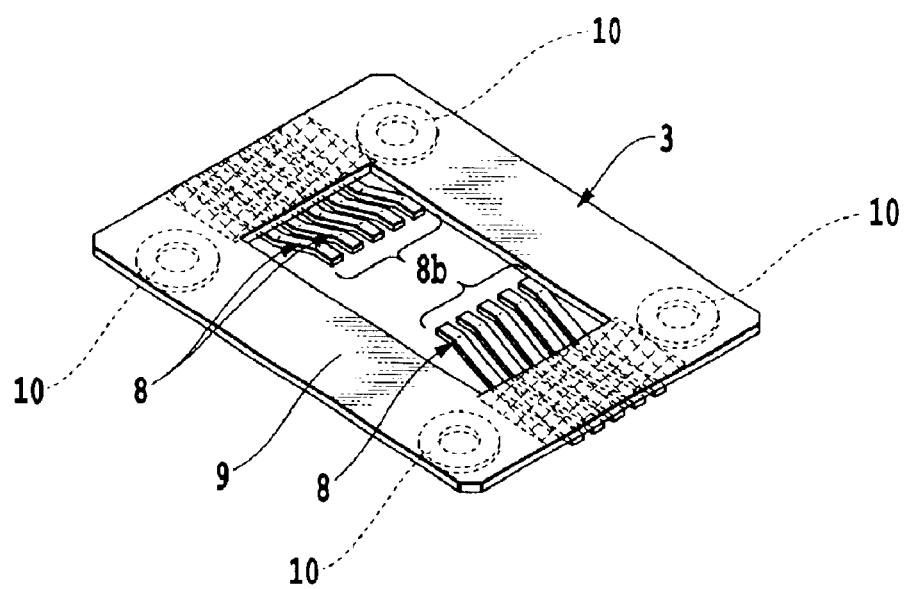
FIG. 13 is a perspective view of a sixth step subsequent to FIG. 12, wherein excessive portions of the contact sheet are cut off.
Figure 14:
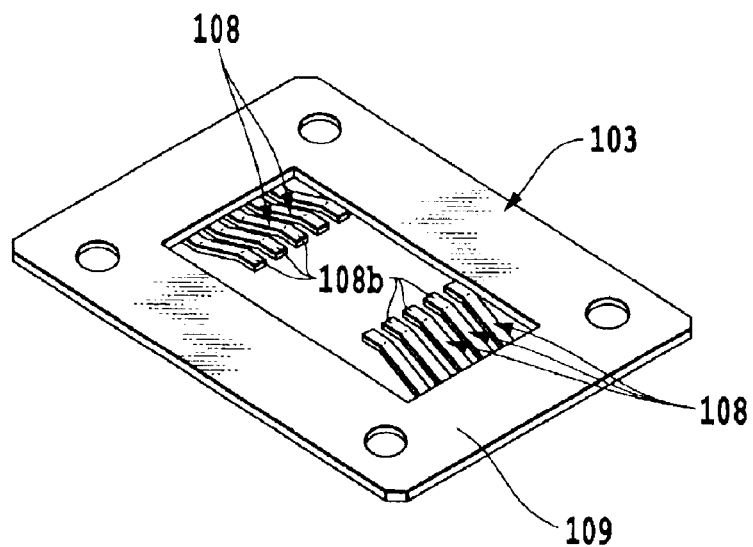
FIG. 14 is a perspective view showing an appearance of a contact sheet in the prior art IC socket.
Figure 15:
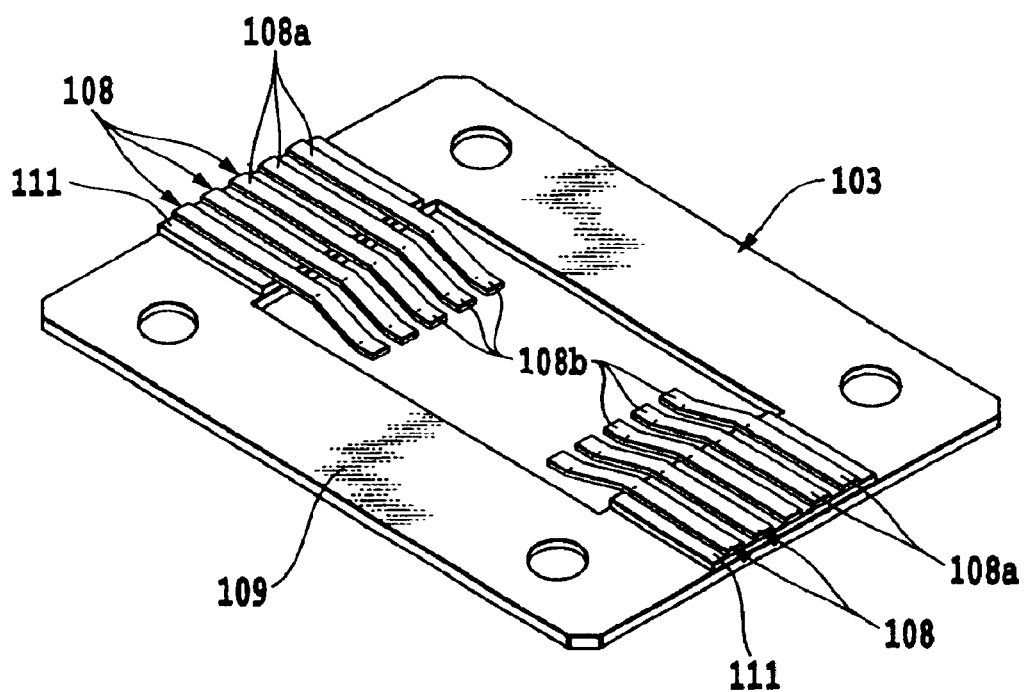
FIG. 15 is a perspective view of a back surface of the contact sheet of the prior art IC socket shown in FIG. 14.
Figure 16:
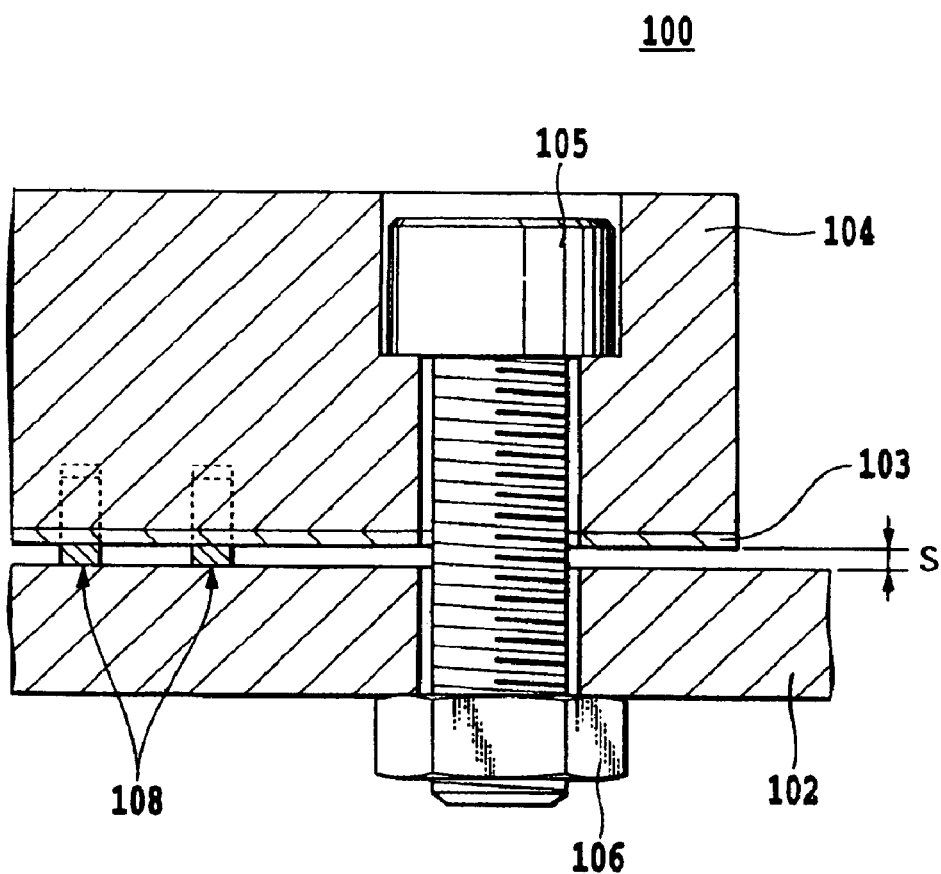
FIG. 16 is an enlarged sectional view of a mounting screw when the prior art IC socket is assembled.
Figure 17:
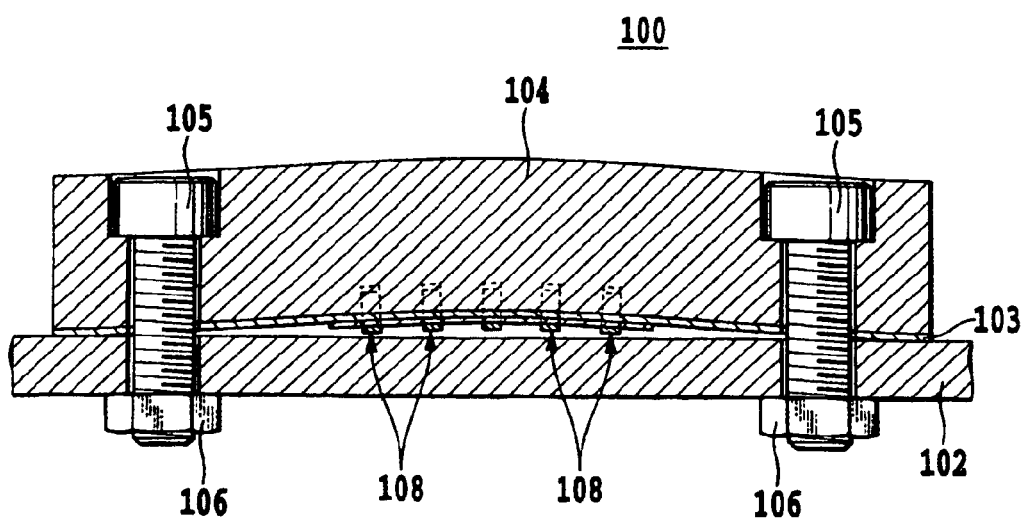
FIG. 17 is a sectional view of part of the prior art IC socket along the mounting screws when the socket frame is warped during the manufacture or the assembly thereof.
Figure 18:
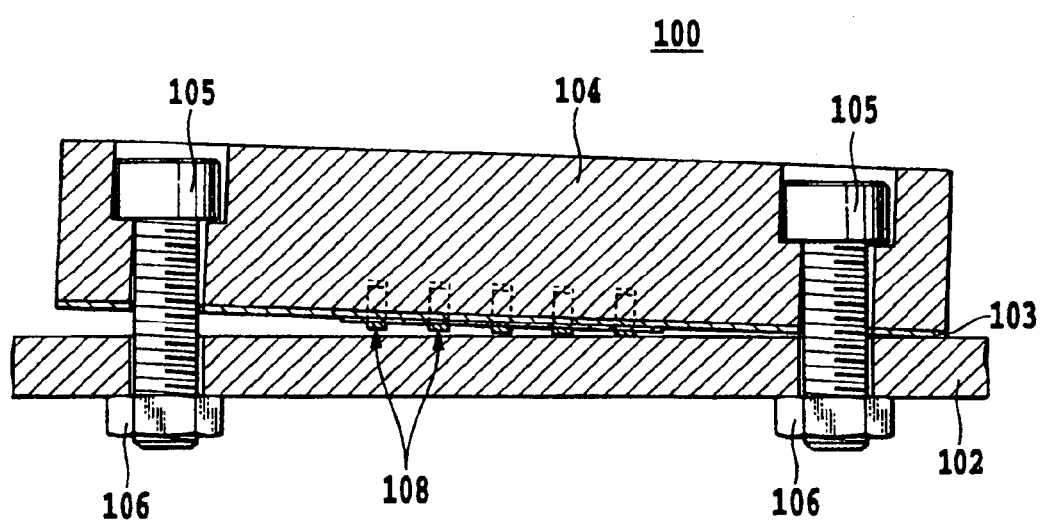
FIG. 18 is a sectional view of part of the prior art IC socket along the mounting screws when the socket frame is inclined during the manufacture or assembly thereof.
Figure 19:
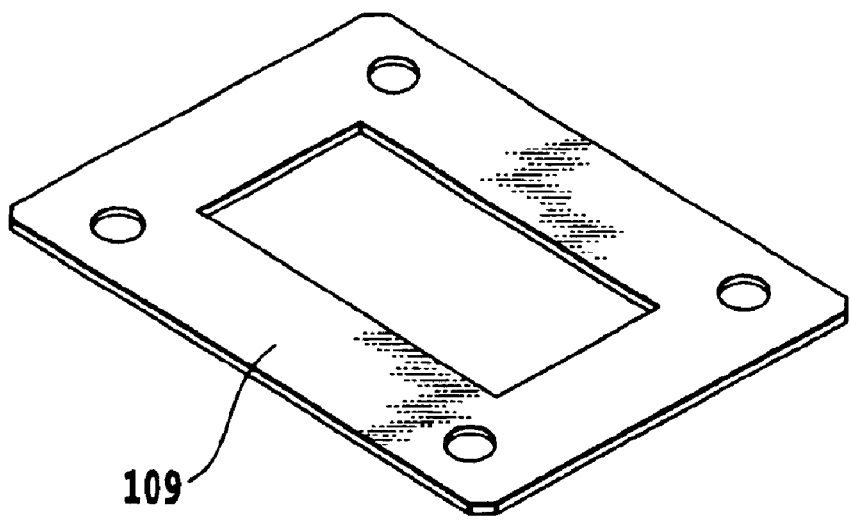
FIG. 19 is a perspective view illustrating the stamping of a sheet at a first step of the manufacture of a contact sheet for the conventional IC socket.
Figure 20:
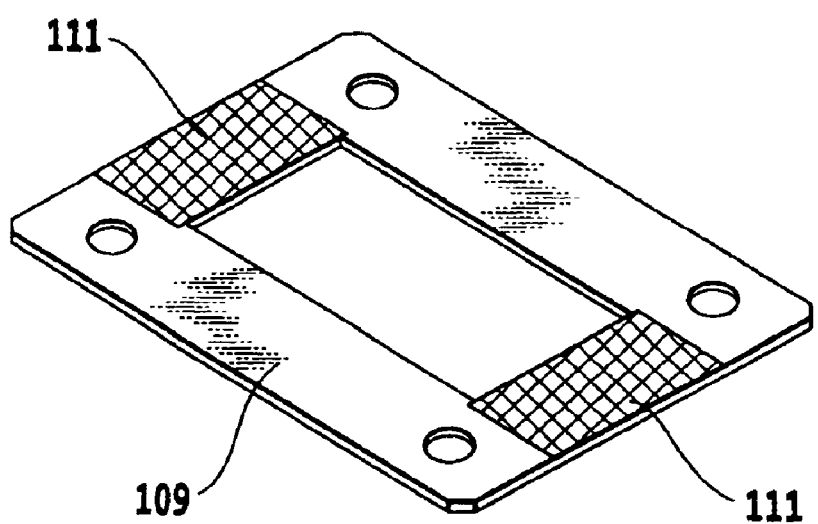
FIG. 20 is a perspective view illustrating the temporary application of adhesive at a second step subsequent to FIG. 19.
Figure 21:
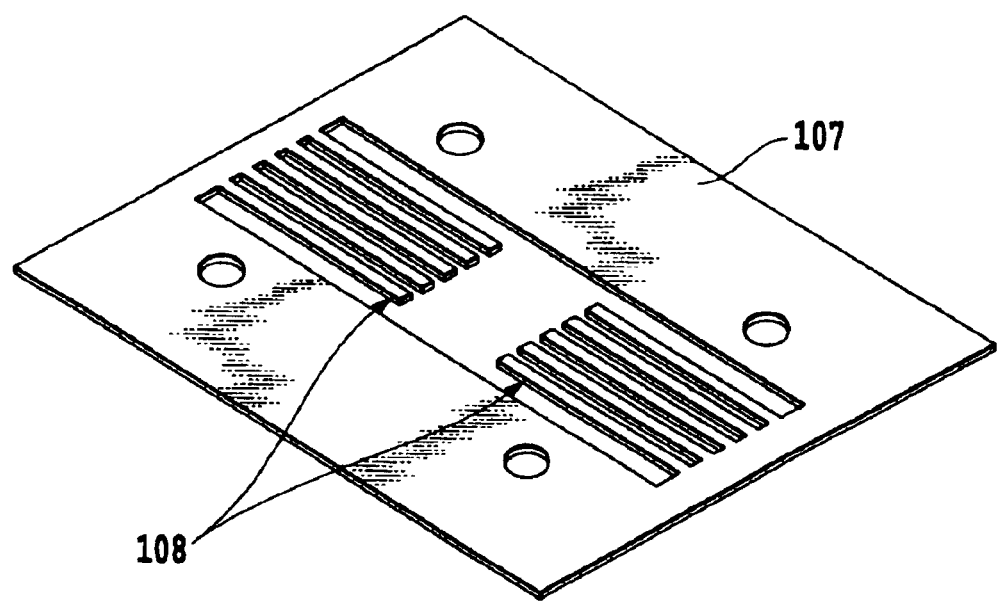
FIG. 21 is a perspective view illustrating the etching of contacts at a third step subsequent to FIG. 20.
Figure 22:
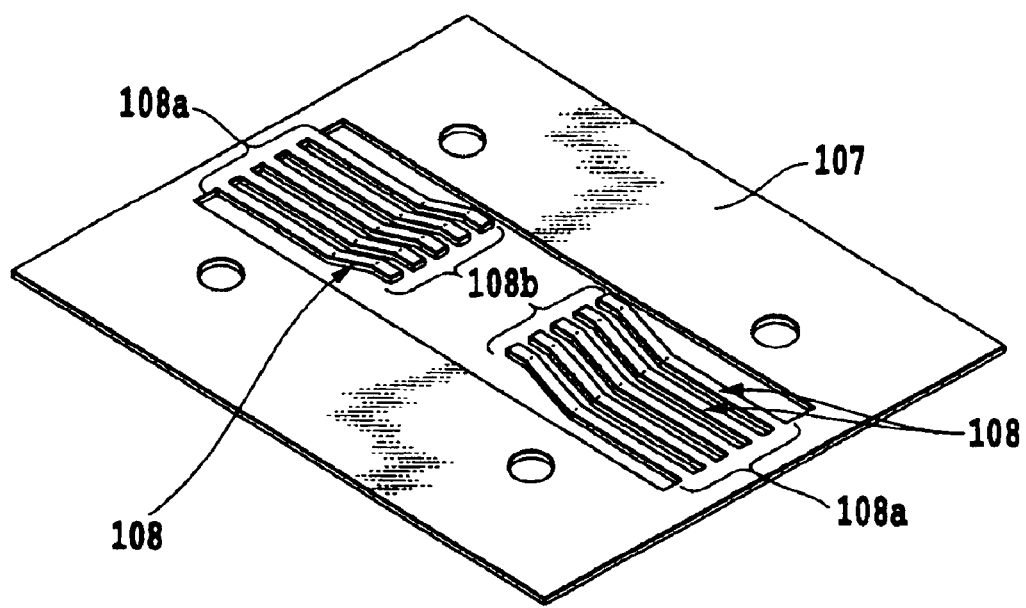
FIG. 22 is a perspective view illustrating the press-bending of the contacts at a fourth step subsequent to FIG. 21.
Figure 23:
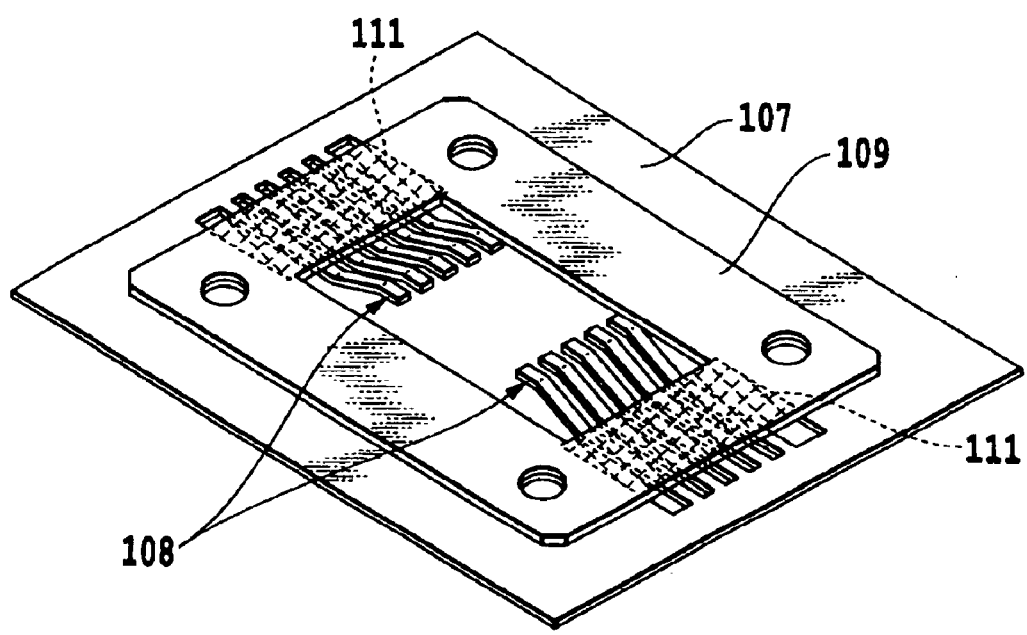
FIG. 23 is a perspective view illustrating the heat-compression adhesion of the contacts to the sheet at a fifth step subsequent to FIG. 22.
Figure 24:
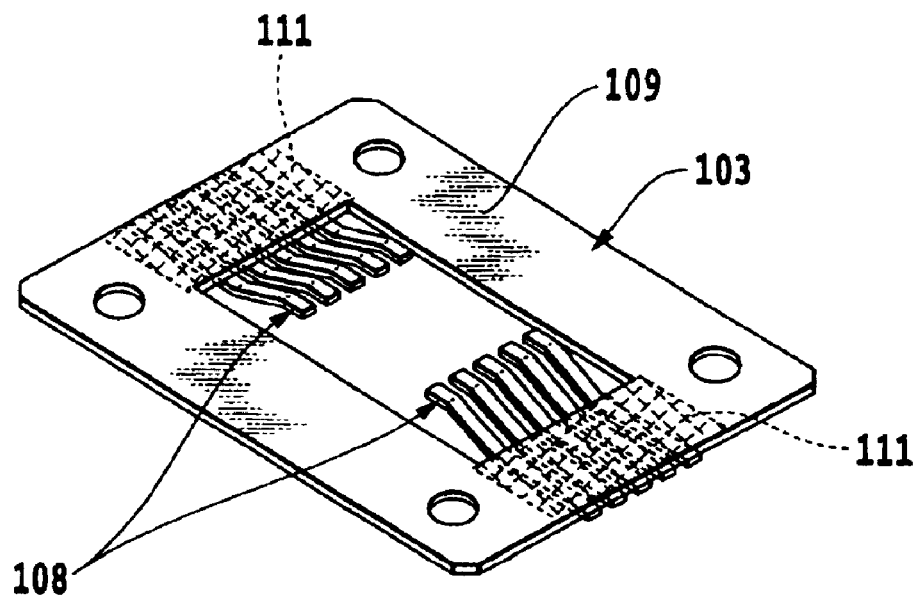
FIG. 24 is a perspective view illustrating the cutting of excessive portions of the contacts at a sixth step subsequent to FIG. 23.

FIGS. 1 to 13 illustrate an IC socket and the steps for manufacturing the same according to the present invention. First, FIG. 1 is a perspective view showing an appearance of an IC socket according to the present invention; FIG. 2 is an exploded perspective view of the IC socket according to the present invention shown in FIG. 1; FIG. 3 is a perspective view of a contact sheet of the IC socket according to the present invention shown in FIG. 1; FIG. 4 is an enlarged perspective view of one contact of the contact sheet shown in FIG. 3; FIG. 5 is a perspective view of a back surface of the contact sheet according to the present invention shown in FIG. 3; FIG. 6 is an enlarged sectional view of a part of the IC socket illustrating a mounting screw when the IC socket according to the present invention is assembled; FIG. 7 is a sectional view of the IC socket shown in FIG. 6, taken along the mounting screws when the socket frame is warped during the manufacture and assembly of the IC socket. Further, FIGS. 8 to 13 show the steps for manufacturing the contact sheet according to the present invention, wherein FIG. 8 is a perspective view of a stamped insulation film of the contact sheet at a first step of the manufacture of the IC socket according to the present invention, FIG. 9 is a perspective view illustrating a temporary application of an adhesive at a second step subsequent to FIG. 8, FIG. 10 is a perspective view illustrating that contacts are formed by etching at a third step subsequent to FIG. 9, FIG. 11 is a perspective view illustrating that the contacts are bent by the press at a fourth step subsequent to FIG. 10, FIG. 12 is a perspective view illustrating that an insulation film is thermocompression bonded to the contacts at a fifth step subsequent to FIG. 11, and FIG. 13 is a perspective view illustrating that excessive portions on the contact sheet are cut off at sixth step subsequent to FIG. 12, which thus is a completed contact sheet of the present invention.

As shown in FIGS. 1 and 2, the IC socket 1 of the present invention is assembled by placing a contact sheet 3 on a test board 2, then placing a socket frame 4 thereon, which are fastened together by screws 5 and nuts 6 to be an integral body.

As shown in FIGS. 3 to 5, the contact sheet 3 used for such an IC socket 1 according to the present invention has a plurality of contacts 8 formed of elastic metallic strips adhered to a back surface of an insulation film 9 such as of polyimide via a heat-compressive adhesive sheet 11, and a plurality of spacer members 10 encircling screw-mounting holes, respectively. In the contact sheet 3, one end 8a of the respective elastic metallic strip of those contacts 8 is located on a circuit 12 on the test board 2, and the insulation film 9 is adhered thereon. On the other hand, the other ends 8b of the contacts 8 each is bent to have a wave shape.

As shown in FIGS. 6 and 7, in the IC socket 1 according to the present invention, the contact sheet 3 having the contacts 8, the spacer members 10 and the heat-compressive adhesive sheet 11 is disposed on the test board 2, and the socket frame 4 is placed thereon, after which both are fastened with screws 5 and nuts 6. In such a manner, the socket frame 4 is fixed to the test board 2 by the screws 5 via the spacer members 10 attached to the back surface of the contact sheet 3 via the spacer member 10, whereby the fixation is favorable without any gap or looseness. An IC package (not shown) is mounted onto the fixed socket frame 4 so that IC leads are disposed on the contacts 8 to be capable of being pressed by a pusher (not shown). Therefore, the free ends 8b of the contacts 8 are arranged above the circuits 12 of the test board 2, so that the both are brought into contact and connected with each other.

FIGS. 8 to 13 illustrate the steps for manufacturing the contact sheet used for the IC socket according to the present invention.

Initially as shown in FIG. 8, at a first stage of the manufacture of the contact sheet of the IC socket, an insulation film 9, for example, of polyimide is stamped to have the illustrated shape. On opposite edges of a back surface of the insulation film 9 stamped to have such a desired shape, as illustrated in FIG. 9, a thermocompression bonded-sheet 11 used as an adhesive for bonding the contacts 8 to the spacer members 10 is temporarily adhered at a second stage.

Simultaneously or concurrently therewith, the contact strips 8 and the spacer members 10 are formed at a third stage by the etching process from a required sheet metal 7 as shown in FIG. 10. That is, metallic strips as raw material of the contacts 8 and the spacer members 10 are simultaneously prepared.

Then, as shown in FIG. 11, the press bending of the contacts are carried out as a fourth stage, whereby a free end of the respective contact 8 is bent. Thus, the insulation film 9 is placed on the sheet metal 7 having the contacts 8 with the bending free ends 8b and the spacer members 10, so that the heat-compressive adhesive sheet 11 temporarily adhered on the insulation film 9 directs downward and heat-compressively adhered thereto as shown in FIG. 12 at a fifth stage.

At a sixth stage, excessive portions of the contact sheet 3 formed of the sheet metal 7 having the contacts 8 and the spacer members 10 to which the insulation film 9 is heat-compressively adhered is cut off to finally obtain the contact sheet 3 of the desired shape as shown in FIG. 13.

When the IC socket 1 using the contact sheet 3 of the present invention is mounted onto the test board 2 as described above, the spacer members 10 are disposed between the test board 2 and the contact sheet 3 in a manner encircling the mounting screws 5, whereby there is no gap between the both. Thus when the mounting screws 5 are fastened in such a state, there is no risk of warping and/or inclination of the socket frame 4, but it is possible to uniformly press the contact sheet 3 with the socket frame 4 on the test board 2 without any looseness.

FIGS. 1 and 2 diagrammatically illustrate the IC socket of the present invention suitable for a flat plate type IC package 998, having IC leads 999, in which FIG. 1 is a perspective view for illustrating the appearance of the IC socket, and FIG. 2 is an exploded perspective view of the IC socket shown in FIG. 1.

As shown in FIGS. 1 and 2, the IC socket 1 according to one embodiment of the present invention is formed by placing the contact sheet 3 on the test board 2, and the socket frame 4 is placed thereon as a carrier, all of which are assembled together by the screws 5 and the nuts 6.

According to such an IC socket 1 of the present invention, as shown in FIGS. 3 to 5, the contact sheet 3 has a plurality of contacts 8 made of elastic metallic strips of a cantilever spring type are disposed on the insulation film 9, for example, of polyimide, so that the contacts are opposed to each other. The cantilever spring type contact 8 is placed so that an outer end 8a of the elastic metallic strip is positioned on a circuit 12 of the test board 2 as a fixing end, and the insulation film 9 is adhered and fixed thereon. On the other hand, the contact 8 of the cantilever spring type is placed so that the inner free end 8b of the elastic metallic strip is curved to have a wave shape, i.e. a shallow V-shape, and placed above the circuit 12 at a gap between the both.

As described above, in the cantilever spring type contact 8 of the present invention, the inner free end 8b is curved to have a wave shape, that is, a shallow V-shape so that a tip thereof extends upward, and is maintained at a position above the insulation film 9 at a sufficient distance from the insulation film 9 in a cantilever manner to be capable of being elastically deformed.

The IC package test can be carried out in a simple manner, as shown, for example, in FIGS. 1 and 2, that is, the contact sheet 3 is placed on the test board 2, and the socket frame 4 is disposed thereon as a carrier, positioned by the screws 5 and fastened by the nuts 5. The IC package is mounted to the fastened socket frame 4 so that the IC leads are disposed on the contacts 8 and pressed by a pusher (not shown).

As described above, the free end 8b of the contact 8 according to the present invention is arranged above the circuit 12 of the test board 12 at a sufficient distance to operate as a contact of a cantilever spring type because the contact 8 is sufficiently elastically deformable. Thus, it is possible to properly adjust a contacting force and/or a displacement amount of the contact as well as to easily improve the durability. Also, according to the IC socket 1 of the present invention, the test can be easily and simply carried out in a short time. Also, it is possible to reduce the number of components of the IC socket, which is advantageous in manufacturing cost thereof.

As stated above, according to the present invention, the contact 8 in the contact sheet 3 of the IC socket 1 is formed as a cantilever spring type contact as best shown in FIGS. 3 to 5. The IC socket 1 of the present invention having such an IC contacts 8 is assembled by the following steps:

As shown in FIGS. 1 and 2, the IC package applied to the IC socket 1 of the present invention is of a flat plate type, and the description has been made on the IC socket 1 for the IC package of such a type in the above-mentioned embodiment.

As shown in FIG. 2, a first step of the assembly of the IC socket 1 according to the present invention is to place the contact sheet 3 having the plurality of contacts 8 and the spacer member 10 adhered on the lower surface thereof via the heat-compressive adhesive sheet 11 onto the test board 2, then dispose the socket frame 4 as a carrier thereon, which are attached and fixed together by the screws 5 and the nuts 6.

Subsequently, as the next step, the IC package is mounted onto the socket frame 4 fixed on the test board 2 via the contact sheet 3 as illustrated, so that the IC leads are disposed above the contacts 8. In this case, the free end 8b of the contact 8 is sufficiently apart from the circuit 12 on the test board 2 as illustrated, and the contact 8 of the cantilever spring type supports the IC lead of the IC package with a sufficient elasticity.

Then, the IC package is pressed onto the IC package mounted to the socket frame 4 by a suitable presser (not shown), whereby the IC lead of the IC package is brought into contact with the contact 8 with a sufficient force; that is, the IC package is favorably electrically connected to the circuits 12 of the test board 2.

According to the IC socket 1 of the present invention, the socket frame 4 is attached to the test board 2 via the contact sheet 3 as a carrier in the first step, and for the contact 8 of such contact sheet 3, the IC package is mounted to the socket frame 4 in the second step. Thus, whereby the IC lead is elastically supported by the contact 8 of a cantilever spring type of the contact sheet 3. In the subsequent step, the IC package is pushed by the pusher or the like to press the IC contact of the IC package to the contact 8 and electrically connect the both to each other. Accordingly, it is possible to reduce the maximum stress of the contact 8, whereby the contacting force and the displacement amount are easily adjustable and the durability is facilitated.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. An IC socket formed by attaching a socket frame to a test board via a contact sheet, wherein the contact sheet includes a plurality of cantilever spring type contacts which are made of strips of sheet metal and oppose each other, said contacts arranged on an insulation film and further include a spacer member made of the sheet metal of the contact sheet simultaneously therewith on said contact sheet, said spacer member positioned to contact said test board so as to compensate for the height of said contacts when said contact sheet is mounted by said socket frame to said socket and said test board.

2. An IC socket as claimed in claim 1, wherein the spacer member is adhered to the insulation film via a heat-compressive adhesive sheet.

3. An IC socket as claimed in claim 1, wherein the insulation film of the contact sheet attached to the socket frame is made of polyimide.

4. An IC socket as claimed in claim 1, wherein a flat plate type IC package is mounted to the socket frame attached to the test board via the contact sheet.

5. An IC socket as claimed in claim 4, wherein the IC leads of the flat plate type IC package are brought into contact with the cantilever spring type contacts of the socket frame.

6. An IC socket as claimed in claim 1, wherein the spacer member encircles a screw mounting hole.

7. An IC socket as claimed in claim 1, wherein each cantilever spring type contact is fixed at one end and has a free end at the other end curved to be located above the test board at a predetermined distance therefrom.

8. An IC socket formed by attaching a socket frame to a test board via a contact sheet, wherein the contact sheet includes a plurality of cantilever spring type contacts arranged on an insulation film and further includes a spacer member;

wherein the cantilever spring type contacts are made of strips of sheet metal and oppose each other; and wherein the spacer member is made of the sheet metal of the contact sheet simultaneously therewith.

9. An IC socket as claimed in claim 8, wherein each cantilever spring type contact is fixed at one end and has a free end at the other end curved to be located above the test board at a predetermined distance therefrom.

10. An IC socket as claimed in claim 8, wherein the spacer member is adhered to the insulation film via a heat-compressive adhesive sheet.

11. An IC socket as claimed in claim 8, wherein the insulation film of the contact sheet attached to the socket frame is made of polyimide.

12. An IC socket as claimed in claim 8, wherein a flat plate type IC package is mounted to the socket frame attached to the test board via the contact sheet.

13. An IC socket as claimed in claim 12, wherein the IC leads of the flat plate type IC package are brought into contact with the cantilever spring type contacts of the socket frame.

14. An IC socket as claimed in claim 8, wherein the spacer member encircles a screw mounting hole.

* * * * *